United States Patent
Suzuki et al.

(10) Patent No.: US 8,384,221 B2
(45) Date of Patent: Feb. 26, 2013

(54) SEMICONDUCTOR DEVICE, LED HEAD AND METHOD OF MANUFACTURING THE SAME

(75) Inventors: Takahito Suzuki, Hachioji (JP); Hiroyuki Fujiwara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 541 days.

(21) Appl. No.: 12/588,642

(22) Filed: Oct. 22, 2009

(65) Prior Publication Data

US 2010/0065859 A1 Mar. 18, 2010

Related U.S. Application Data

(62) Division of application No. 11/445,241, filed on Jun. 2, 2006, now Pat. No. 7,625,809, which is a division of application No. 10/936,701, filed on Sep. 9, 2004, now Pat. No. 7,078,729.

(30) Foreign Application Priority Data

Sep. 11, 2003 (JP) .................................. 2003-319423

(51) Int. Cl.
*H01L 23/48* (2006.01)

(52) U.S. Cl. ... 257/758; 257/761; 257/763; 257/E23.16; 257/E25.02; 257/E27.121; 257/82; 257/499; 257/774; 257/98; 257/E33.068; 347/238; 347/130

(58) Field of Classification Search ............ 257/99, 257/623, E25.02, E33.057, 82, 503, 758, 257/781, 545, 88, 443, 723, 79, 81, 92; 347/238, 347/130
See application file for complete search history.

(56) References Cited

U.S. PATENT DOCUMENTS

| | | | |
|---|---|---|---|
| 5,187,377 A | | 2/1993 | Katoh |
| 5,451,977 A | * | 9/1995 | Kusuda et al. .................. 345/44 |
| 5,466,631 A | | 11/1995 | Ichikawa et al. |
| 5,684,523 A | * | 11/1997 | Satoh et al. .................. 347/247 |
| 6,365,429 B1 | | 4/2002 | Kneissl et al. |
| 7,061,113 B2 | * | 6/2006 | Fujiwara et al. ............. 257/758 |
| 7,078,729 B2 | * | 7/2006 | Suzuki et al. .................. 257/79 |
| 7,135,708 B2 | * | 11/2006 | Ogihara et al. ............... 257/81 |
| 7,408,566 B2 | * | 8/2008 | Ogihara et al. ............. 347/238 |
| 7,486,307 B2 | * | 2/2009 | Ogihara et al. ............. 347/238 |
| 7,999,275 B2 | * | 8/2011 | Ogihara et al. ................ 257/98 |
| 2002/0096994 A1 | | 7/2002 | Iwafuchi et al. |
| 2004/0089939 A1 | * | 5/2004 | Ogihara et al. ............. 257/690 |
| 2004/0094770 A1 | * | 5/2004 | Ogihara et al. ................ 257/79 |
| 2004/0115849 A1 | | 6/2004 | Iwafuchi et al. |

FOREIGN PATENT DOCUMENTS

| | | |
|---|---|---|
| CN | 1343013 A | 4/2002 |
| DE | 195 14 073 A1 | 11/1995 |
| EP | 1 306 899 A1 | 5/2003 |
| EP | 1 326 288 A2 | 9/2003 |
| JP | 60-32373 | 2/1985 |
| JP | 1-195068 | 8/1989 |
| JP | 1-225377 | 9/1989 |
| JP | 2-7588 | 1/1990 |
| JP | 7-74341 | 3/1995 |
| JP | 11-291538 | 10/1999 |
| JP | 2001-244543 | 9/2001 |
| JP | 2002-33546 | 1/2002 |
| JP | 2003-86836 | 3/2003 |

* cited by examiner

*Primary Examiner* — Zandra Smith
*Assistant Examiner* — Tsz Chiu
(74) *Attorney, Agent, or Firm* — Rabin & Berdo, P.C.

(57) ABSTRACT

A semiconductor device includes a substrate, and a semiconductor thin film bonded to the substrate, wherein the semiconductor thin film includes a plurality of discrete operating regions and an element isolating region which isolates the plurality of discrete operating regions, and the element isolating region is etched to a shallower depth than a thickness of the semiconductor thin film, and is a thinner region than the plurality of discrete operating regions.

14 Claims, 8 Drawing Sheets

SEMICONDUCTOR DEVICE, LED HEAD AND METHOD OF MANUFACTURING THE SAME

This is a Divisional of U.S. application Ser. No. 11/445,241, filed Jun. 2, 2006, U.S. Pat. No. 7,625,809 and allowed on Jul. 24, 2009, which was a Divisional of U.S. application Ser. No. 10/936,701, filed Sep. 9, 2004, and issued as a U.S. Pat. No. 7,078,729 on Jul. 18, 2006, the subject matters of which are incorporated herein by reference.

BACKGROUND OF THE INVENTION

1. Field of the Invention

The present invention relates to a semiconductor device formed by bonding a semiconductor thin film such as an LED epitaxial film to a substrate, to an LED print head using this semiconductor device, to an image-forming apparatus using this LED print head, and to a method of manufacturing the semiconductor device.

2. Description of the Related Art

In the conventional art, the electrical connection between an LED chip and a driver IC chip for driving and controlling the LED chip, was made by a bonding wire (e.g., Japanese Patent Laid-Open Publication No. 2001-244543). FIG. 13 is a perspective view schematically showing a conventional semiconductor device wherein an LED chip and a driver IC chip are connected by bonding wires, and FIG. 14 is a perspective view showing an enlargement of the LED chip of FIG. 13. As shown in FIG. 13 or FIG. 14, the semiconductor device includes a unit board 301, an LED chip 302, and a driver IC chip 303. The LED chip 302 includes light-emitting parts 304, discrete electrodes 305, and electrode pads 306. The electrode pads 306 of the LED chip 302 and the electrode pads 307 of the bonding IC chip 303 are connected by bonding wires 308. Further, electrode pads 309 of the driver IC chip 303 and electrode pads 310 of the unit board 301 are connected by bonding wires 311.

However, in the aforesaid conventional semiconductor device, a surface area of electrode pads 306 (e.g., of the order of 100 μm×100 μm) is larger than the surface area occupied by the light-emitting parts 304 on the LED chip 302. Therefore, as long as the electrode pads 306 are provided, it is difficult to reduce the chip width of the LED chip 302, and difficult to reduce the material cost of the LED chip 302.

SUMMARY OF THE INVENTION

It is therefore an object of the present invention to provide a semiconductor device which permits a major reduction of material cost, an LED print head using this semiconductor device, an image-forming apparatus using this LED print head, and a method of manufacturing the semiconductor device.

A semiconductor device according to the present invention includes a substrate, and a semiconductor thin film bonded to the substrate. The semiconductor thin film includes a plurality of discrete operating regions, each of which has an operating layer, and an element isolating region, which is a thinned region of said semiconductor thin film mutually isolating the operating layers of the plurality of discrete operating regions.

An LED print head according to the present invention includes the above semiconductor device and a holder for holding the semiconductor device.

An image-forming according to the present invention includes the above LED print head, and a photosensitive body installed facing the LED print head.

A method of manufacturing a semiconductor device according to the present invention includes forming a semiconductor thin film including a plurality of discrete operating regions, each of which has an operating layer, on a first substrate such that the semiconductor thin film can be separated from first substrate; bonding the semiconductor thin film which has been separated from the first substrate to a second substrate; and forming an element isolating region by etching a region other than the plurality of discrete operating regions of the semiconductor thin film bonded to the second substrate so as to mutually isolate the operating layers of the plurality of discrete operating regions.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

Figure 1:
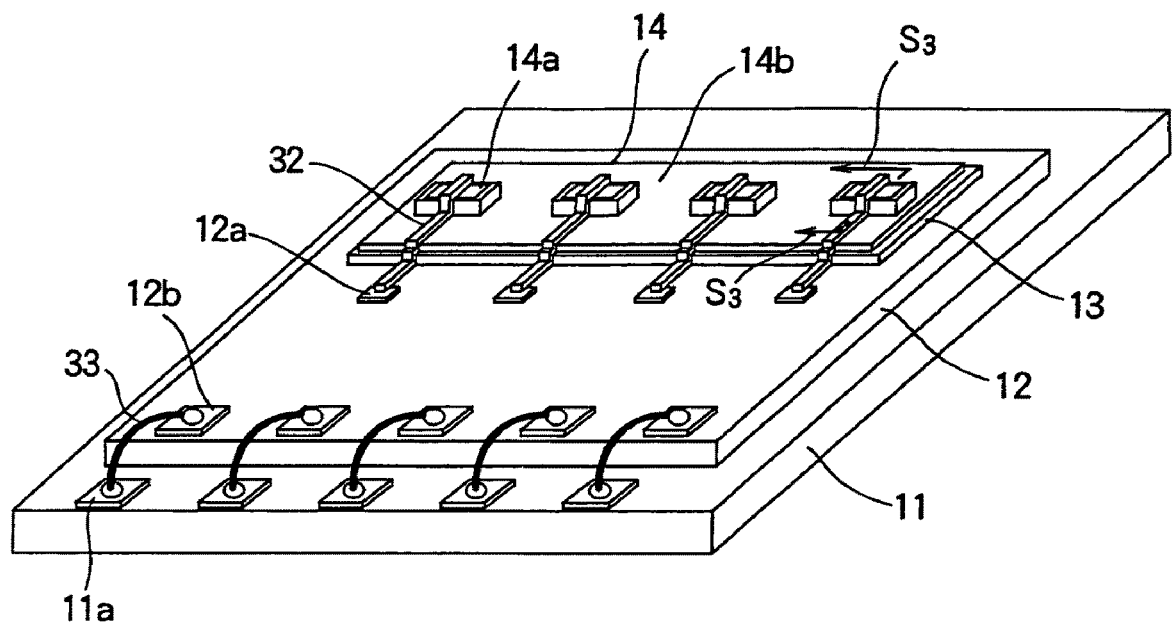
FIG. 1 is a perspective view schematically showing the construction of a semiconductor device according to a first embodiment of the present invention.
Figure 2:
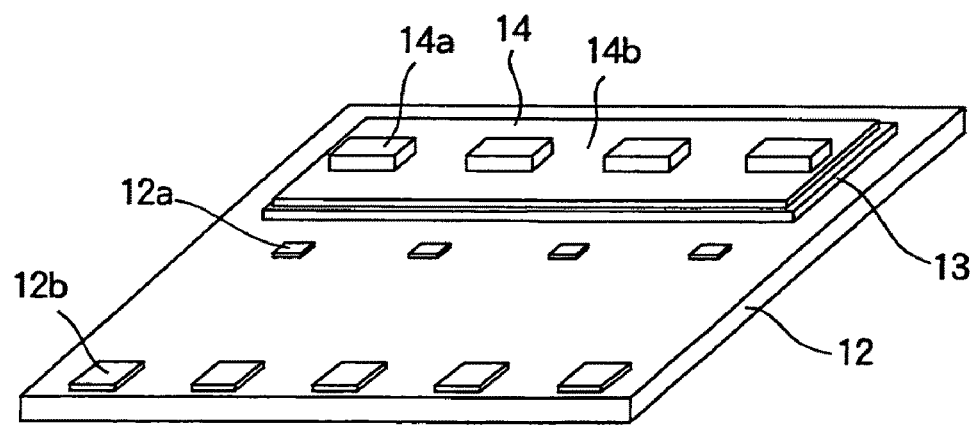
FIG. 2 is a perspective view schematically showing a driver IC chip, metal layer, and LED epitaxial film of the semiconductor device of FIG. 1.

FIG. 1 is a perspective view schematically showing the construction of a semiconductor device according to a first embodiment of the present invention. FIG. 2 is a perspective view showing a driver IC chip, metal layer, and LED epitaxial film of the semiconductor device of FIG. 1, and FIG. 3 is a cross-sectional view schematically showing a section through a line $S_3$-$S_3$ in the semiconductor device of FIG. 1.

Figure 3:
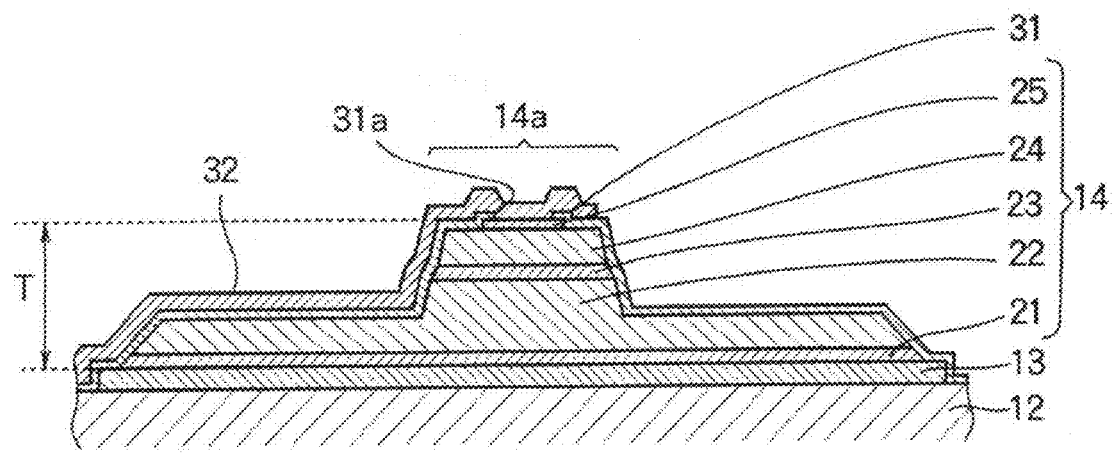
FIG. 3 is a cross-sectional view schematically showing a section through a line $S_3$-$S_3$ in the semiconductor device of FIG. 1.

As shown in FIG. 1, FIG. 2, or FIG. 3, the semiconductor device according to the first embodiment includes a unit board 11, a driver IC chip 12 fixed on the unit board 11, a metal layer 13 formed on the driver IC chip 12, and an LED epitaxial film 14 which is a semiconductor thin film bonded on the metal layer 13.

The driver IC chip 12 is an Si substrate in which an LED control driver IC is formed. Plural electrode terminals 12a and plural electrode terminals 12b connected to the driver IC are provided on the surface of the driver IC chip 12.

The LED epitaxial film 14 includes a plurality of discrete operating regions (light-emitting parts, i.e., LEDs) 14a and an element isolating region 14b which electrically isolates the plurality of discrete operating regions 14a from each other. The element isolating region 14b is a region wherein the LED epitaxial film 14 is etched to a shallower depth than the thickness of the LED epitaxial film 14, and is a thinner region than the plurality of discrete operating regions 14a. The LED epitaxial film 14, as shown in FIG. 3, has a multilayer semiconductor epitaxial structure wherein a lower contact layer 21, a lower cladding layer 22, an activation layer 23 as an operating layer, an upper cladding layer 24, and an upper contact layer 25 are provided in that order from the side of the driver IC chip 12. For example, the lower contact layer 21 is an n-GaAs layer, the lower cladding layer 22 is an n-Al$_z$Ga$_{1-z}$As layer, the activation layer 23 is an Al$_y$Ga$_{1-y}$As layer, the upper cladding layer 24 is a p-Al$_x$Ga$_{1-x}$As layer, and the upper contact layer 25 is a p-GaAs layer. Herein, the values of x, y, and z are respectively set within a range from zero to unity so as to obtain high light-emitting efficiency. The epitaxial layers forming the LED epitaxial film 14 are not limited to the aforesaid example.

The thickness T of the LED epitaxial film 14 may be selected from among various thicknesses, but the thickness T may be made as thin as about 2 μm. The etching depth required to isolate the light-emitting regions 14a may be to immediately above the activation layer 23 (when the activation layer 23 is non-doped), or may be to below a top surface of the lower cladding layer 22. FIG. 3 shows the case where etching has been performed to below the top surface of the lower cladding layer 22.

The metal layer 13 is formed, for example, in a region where the driver IC is formed, or a region adjacent to the region where the driver IC is formed, on the surface of the driver IC chip 12, wherein the region where the driver IC is formed is a flat region. The metal layer 13 may, for example, be palladium, gold, or the like. The metal layer 13 may, for example, be formed by chemical vapor deposition or sputtering. The LED epitaxial film 14 is bonded to the surface of the metal layer 13. The metal layer 13 has the function of fixing the LED epitaxial film 14, which is stuck to the metal layer 13, to the driver IC chip 12, and the function of electrically connecting a common terminal region (lower contact layer 21) on the lower surface of the LED epitaxial film 14 and a common terminal region of the driver IC chip 12 (not shown). Ohmic contacts are preferably formed between the metal layer 13 and the lower contact layer 21 in the LED epitaxial film 14, and between the metal layer 13 and the common terminal region of the driver IC chip 12. The bonding of the LED epitaxial film 14 to the metal layer 13 may, for example, be achieved by intermolecular forces between the epitaxial film and the metal layer, and by a reaction between the epitaxial film and the metal layer (atomic rearrangement of interface).

As shown in FIG. 1 and FIG. 3, the semiconductor device according to the first embodiment further includes discrete interconnection layers (thin film interconnections) 32 extending from tops of the discrete operating regions 14a through the element isolating region 14b to the driver IC chip 12. As shown in FIG. 3, an interlayer insulating film 31 is provided between the LED epitaxial film 14 and the discrete interconnection layer 32, the discrete interconnection layer 32 being connected to the upper contact layer 25 via openings 31a in the interlayer insulating film 31. The discrete interconnection layers 32 electrically connect the upper surfaces of the light-emitting part 14a of the LED epitaxial film 14, and the discrete terminal regions 12a of the IC chip 12. The discrete interconnection layer 32 is a thin film metal interconnection or the like, e.g., an Au layer, a Pd layer, a Pd/Au laminated layer, an Al layer, or a polysilicon layer. A plurality of discrete interconnection layers 32 may be formed all at once using a photolithography technique.

The unit board 11 has electrode pads 11a on its surface. The electrode terminals 12b of the driver IC chip 12 and the electrode pads 11a of the unit board 11 are connected by bonding wires 33.

Figure 4:
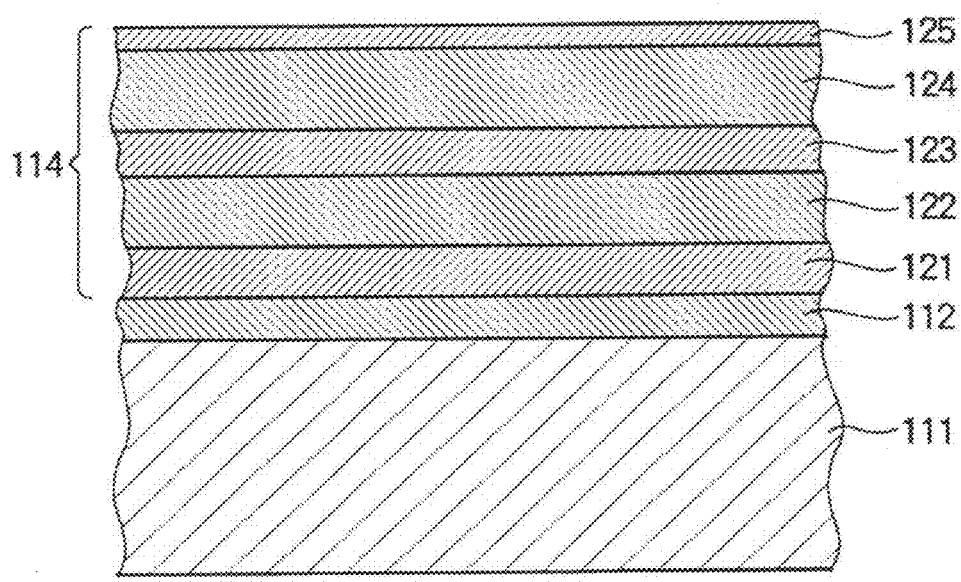
FIG. 4 is a cross-sectional view schematically showing process for manufacturing the semiconductor device according to the first embodiment.
Figure 5:
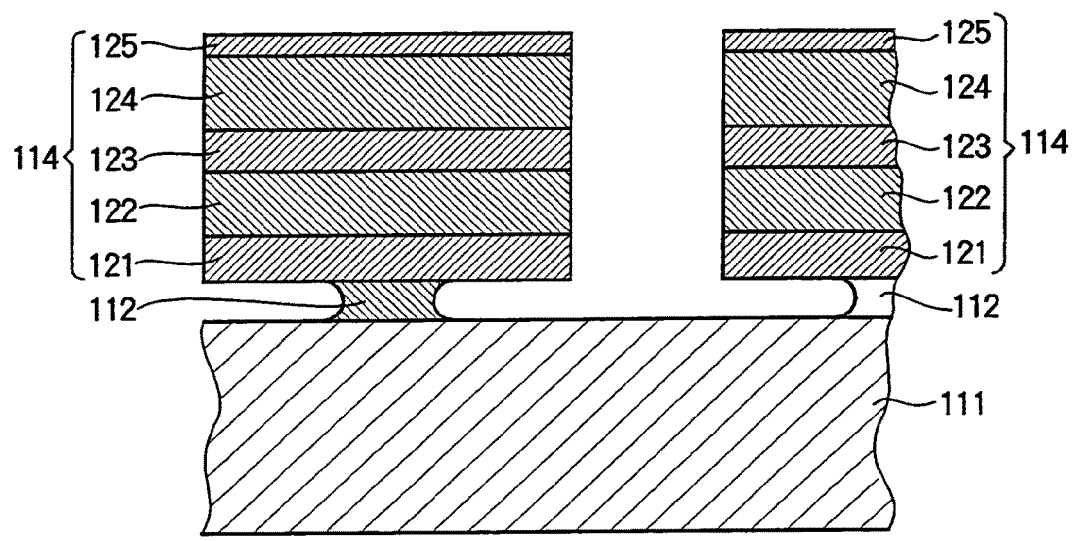
FIG. 5 is a cross-sectional view schematically showing process for manufacturing the semiconductor device according to the first embodiment.

Next, the method of manufacturing a semiconductor device according to the first embodiment will be described. FIG. 4 and FIG. 5 are cross-sectional views schematically showing process for manufacturing a semiconductor device according to the first embodiment. As shown in FIG. 4, first, a separation layer (sacrificial layer) 112 is formed on a manufacturing substrate (e.g., a GaAs substrate) 111 for forming the LED epitaxial layer 114, and the LED epitaxial layer (semiconductor thin film) 114 including a plurality of discrete operating regions is formed on the sacrificial layer 112. The LED epitaxial layer 114 can be manufactured by the metal oxide chemical vapor deposition method (MOVCD method), metal oxide vapor phase epitaxy method (MOVPE method), molecular beam epitaxy method (MBE method), or the like known in the art. The LED epitaxial layer 114 includes an n-GaAs layer 121, an n-Al$_z$Ga$_{1-z}$As layer 122, an Al$_y$Ga$_{1-y}$As layer 123, a p-Al$_x$Ga$_{1-x}$As layer 124, and a p-GaAs layer 125, which correspond to the lower contact layer 21, the lower cladding layer 22, the activation layer 23, the upper cladding layer 24, and the upper contact layer 25, respectively.

On the other hand, as shown in FIG. 1, the metal layer 13 is formed by chemical vapor deposition or sputtering on the driver IC chip (Si substrate) 12. Next, the LED epitaxial film (the LED epitaxial layer 114) is obtained by etching part of the LED epitaxial layer 114 and the sacrificial layer 112 as shown in FIG. 5 and peeling (i.e., separating) the LED epitaxial layer 114 away from the GaAs substrate 111 by the chemical lift-off method, and the LED epitaxial film is bonded to the metal layer 13 of the driver IC chip 12.

Next, as shown in FIG. 1, an element isolating region 14b which electrically isolates the plurality of discrete operating regions 14a, is formed by etching a region other than the plurality of discrete operating regions 14a of the LED epitaxial film 14 bonded to the driver IC chip to a shallower depth than the thickness of the LED epitaxial film 14. In the etching, a resist is used to prevent etching of the discrete operating regions 14a and etch the element isolating region 14b. The etching solution used may, for example, be a solution of phosphoric acid, and the etching temperature may, for example, be of the order of 30° C. The etching time is determined based on a pre-obtained etching rate and the desired etching depth. However, the etching conditions are not limited to these examples. Next, the interlayer insulating film 31 is formed, and the discrete interconnection layers 32 extending from the tops of the discrete operating regions 14a over the element isolating region 14b to the tops of the discrete electrode terminals 12a of the driver IC chip 12, are formed by a photolithography technique.

As described above, in the semiconductor device according to the first embodiment, the thin LED epitaxial film 14 which has a thickness of several micrometers is used as the light-emitting element device, so the light-emitting parts 14a of the LED epitaxial film 14 and the discrete electrode terminals 12a of the driver IC chip 12 can be connected by the discrete interconnection layers 32. Therefore, it is unnecessary to provide electrode pads on the LED epitaxial film 14, and due to the reduction in the surface area of the LED epitaxial film 14, major material cost savings can be achieved.

In the semiconductor device according to the first embodiment, the element isolating region 14b is formed so that there is no reduction in the contact area between the LED epitaxial film 14 and the driver IC chip 12, hence the electrical properties of the discrete operating regions 14a can be enhanced without reducing the adhesion strength of the LED epitaxial film 14 on the driver IC chip 12.

Figure 6:
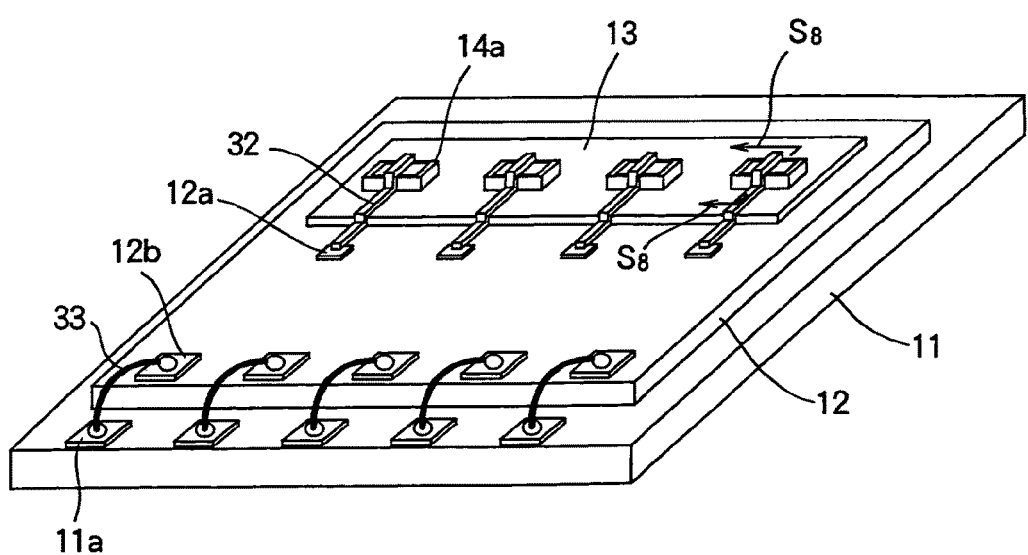
FIG. 6 is a perspective view schematically showing the construction of a semiconductor device in a comparative example.
Figure 7:
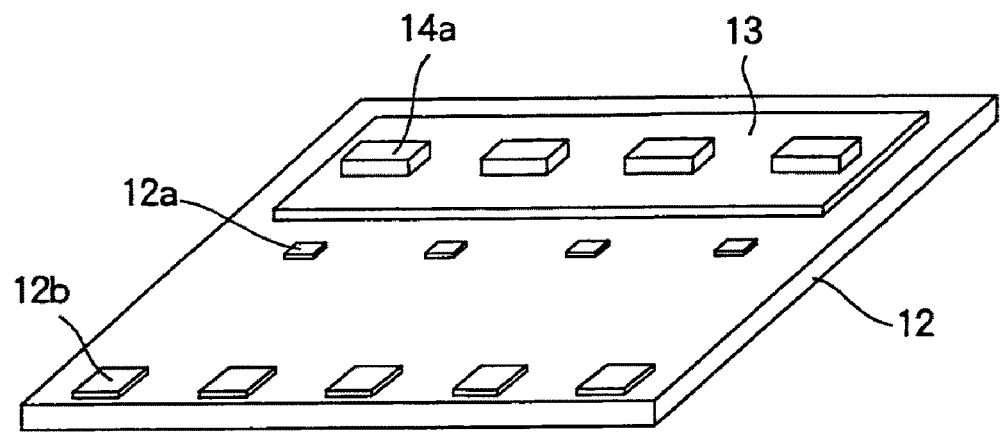
FIG. 7 is a perspective view schematically showing a driver IC chip, metal layer, and LED epitaxial film of the semiconductor device of FIG. 6.
Figure 8:
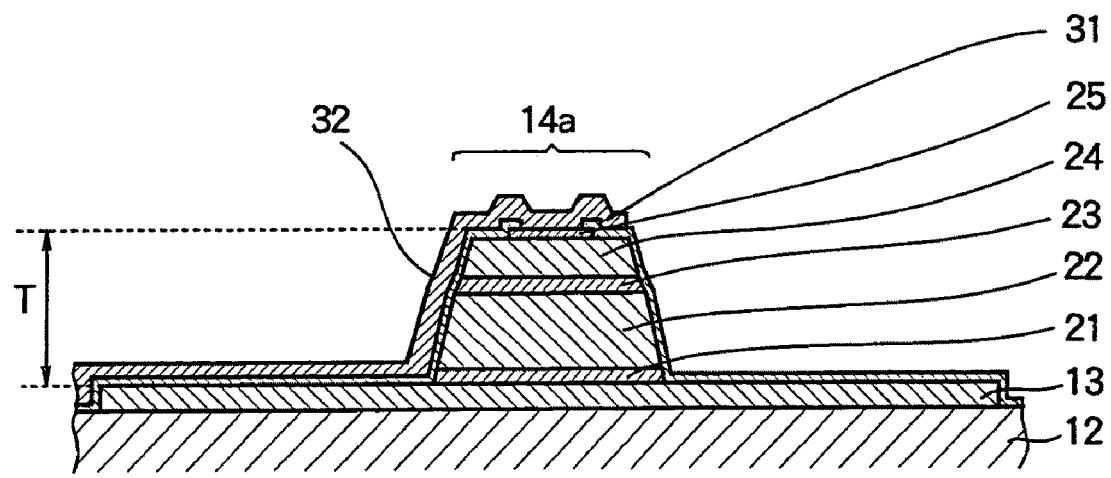
FIG. 8 is a cross-sectional view schematically showing a section through a line $S_8$-$S_8$ in the semiconductor device of FIG. 6.

Also, in the semiconductor device according to the first embodiment, the contact surface area of the LED epitaxial film 14 with the driver IC chip 12 is large, so contact resistance can be reduced. Herein, for reference purposes, a comparison will be made with the case where the elements are separated by completely etching a region other than the light-emitting part of the LED epitaxial film (comparative example). FIG. 6 is a perspective view schematically showing the construction of the semiconductor device according to this comparative example. FIG. 7 is a perspective view showing the driver IC chip, metal layer and LED epitaxial film of the semiconductor device of FIG. 6, and FIG. 8 is a cross-sectional view schematically showing a section through a line $S_8$-$S_8$ in the semiconductor device of FIG. 6. In the case of the comparative example shown in FIG. 6 to FIG. 8, as the semiconductor thin film is only the light emitting parts 14a, the contact area is extremely small, but the contact surface area of the LED epitaxial film 14 of the semiconductor device in the first embodiment is the sum of the surface areas of the light-emitting parts 14a and the element isolating region 14b, so the contact surface area is extremely large.

In the semiconductor device according to the first embodiment, the metal layer 13 is disposed on the undersurface of the LED epitaxial film 14, so light emitted from the light-emitting parts 14a in the direction of the undersurface (i.e., towards the driver IC chip 12) can be extracted in the surface direction as light reflected by the metal layer 13, and the power of the emitted light is thus increased.

Further, in the semiconductor device according to the first embodiment, part of the LED epitaxial film 14 remains on the element isolating region 14b of the LED epitaxial film 14, so steps on the LED epitaxial film 14 are reduced, and the occurrence of breaks in thin film interconnections such as the discrete interconnection layers can be reduced.

In the aforesaid description, the case was described where the semiconductor device was a light-emitting element array, but the present invention may be applied also to a semiconductor device other than a light-emitting element array.

Second Embodiment

Figure 9:
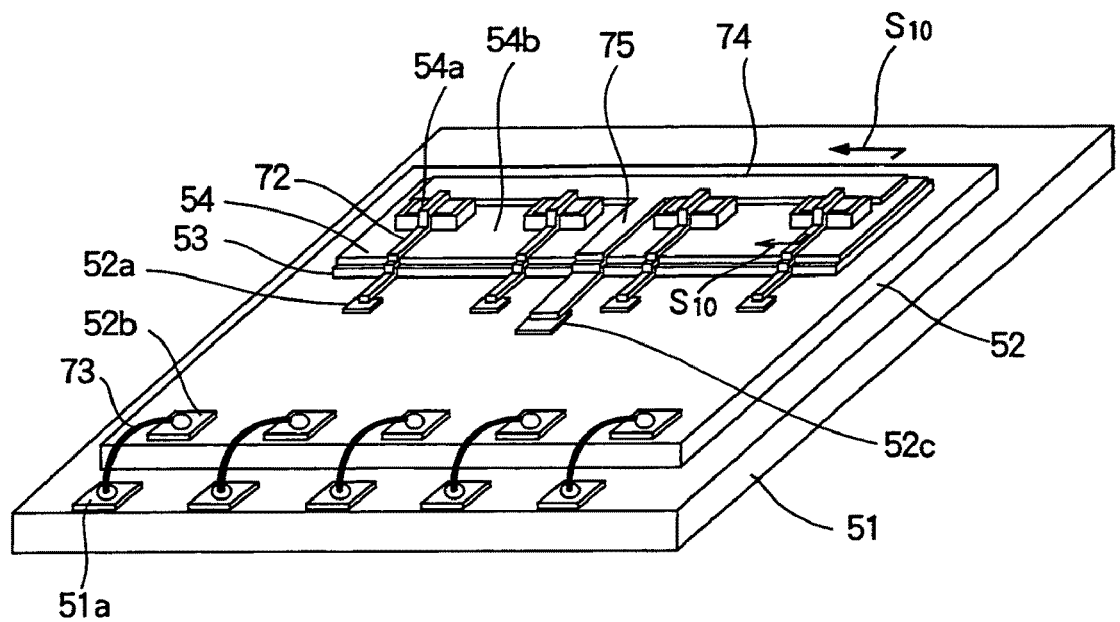
FIG. 9 is a perspective view schematically showing the construction of a semiconductor device according to a second embodiment of the invention.
Figure 10:
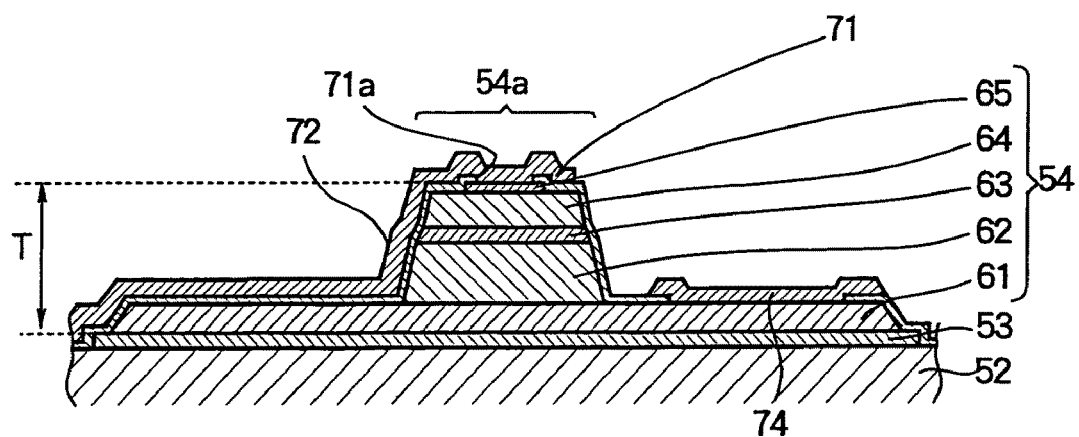
FIG. 10 is a cross-sectional view schematically showing a section through a line $S_{10}$-$S_{10}$ in the semiconductor device of FIG. 9.

FIG. 9 is a perspective view schematically showing the construction of a semiconductor device according to a second embodiment of the present invention. FIG. 10 is a cross-sectional view schematically showing a section through a line $S_{10}$-$S_{10}$ in the semiconductor device of FIG. 9.

As shown in FIG. 9 or FIG. 10, the semiconductor device according to the second embodiment includes a unit board 51, a driver IC chip 52 fixed to the unit board 51, and an LED epitaxial film 54 which is a semiconductor thin film bonded to the driver IC chip 52. The driver IC chip 52 and the LED epitaxial film 54 are bonded by an adhesive 53.

The LED epitaxial film 54 includes a plurality of discrete operating regions (light-emitting regions, i.e., LEDs) 54a, and an element isolating region 54b which electrically isolates the plurality of discrete operating regions 54a from each other. The element isolating region 54b is a region wherein the LED epitaxial film 54 has been etched to a shallower depth than the thickness of the LED epitaxial film 54, and is a thinner region than the plurality of discrete operating regions 54a. The LED epitaxial film 54, as shown in FIG. 10, has a multilayer semiconductor epitaxial structure including, in order from the side of the driver IC chip 52, a lower contact layer 61, a lower cladding layer 62, an activation layer 63, an upper cladding layer 64, and an upper contact layer 65. For example, the lower contact layer 61 is an n-GaAs layer, the lower cladding layer 62 is an n-$Al_zGa_{1-z}As$ layer, the activation layer 63 is an $Al_yGa_{1-y}As$ layer, the upper cladding layer 64 is a p-$Al_xGa_{1-x}As$ layer, and the upper contact layer 65 is a p-GaAs layer. Herein, the values of x, y, and z are respectively set within a range from zero to unity so as to obtain high light-emitting efficiency. The epitaxial layers forming the LED epitaxial film 54 are not limited to the aforesaid example.

The thickness T of the LED epitaxial film 54 may be selected from among various thicknesses, but the thickness T may be made as thin as about 2 μm. Further, in the second embodiment, the element isolating region 54b is formed from part of the lower contact layer 61. Here, the case is shown where the etching depth to electrically isolate the light-emitting parts 54 extends to midway in the lower contact layer 61. As a result, the thickness of the lower contact layer 61 is made larger than that of the contact layer 21 in the first embodiment. The thickness of the lower contact layer 61 may be set within a range in which etching can be stopped midway in the lower contact layer 61.

As shown in FIG. 9 and FIG. 10, the semiconductor device according to the second embodiment further includes discrete interconnection layers (thin film interconnections) 72 which extend from the tops of the discrete operating regions 54a over the element isolating region 54b to the tops of the driver IC chip 52. As shown in FIG. 10, an interlayer insulating film 71 is provided between the LED epitaxial film 54 and the discrete interconnection layer 72, the discrete interconnection layer 72 being connected to the upper contact layer 65 via openings 71a in the interlayer insulating film 71. The discrete interconnection layers 72 electrically connect the upper surfaces of the light-emitting parts of the LED epitaxial film 54 with discrete terminal regions 52a of the driver IC chip 52.

The unit board 51 has electrode pads 51a on its surface. The electrode terminals 52b of the driver IC chip 52 and the electrode pads 51a of the unit board 51 are connected by bonding wires 73.

As shown in FIG. 9 and FIG. 10, an electrode pad 74 is provided on the lower contact layer 61, the electrode pad 74, and a common electrode terminal 52c of the driver IC chip 52 being connected by a common interconnection layer (thin film interconnection) 75. The discrete interconnection layers 72 and the common interconnection layer 75 may, for example, be thin film metal interconnections, and may be formed all at once by a photolithography technique. Hence, in the second embodiment, both the discrete interconnection layers 72 and the common interconnection layer 75 are provided on the upper side of the LED epitaxial film 54, so the contact resistance of the underside of the LED epitaxial film 54 does not have to be taken into account. As a result, there is more freedom of choice in the adhesive 53 used to improve the bonding strength of the LED epitaxial film 54, and the adhesion strength can be enhanced. Also, as the whole of the LED epitaxial film 54 is connected by the lower contact layer 61, it can be widened by the common electrode pad 74 and the contact resistance can be reduced compared to the first embodiment.

In the semiconductor device according to the second embodiment, in the same way as in the first embodiment, major material cost reductions, improved adhesion strength of the LED epitaxial film 54 and improved electrical properties of the discrete operating regions can be obtained. Except for the above-mentioned points, the semiconductor device of the second embodiment is the same as that of the first embodiment.

Third Embodiment

Figure 11:
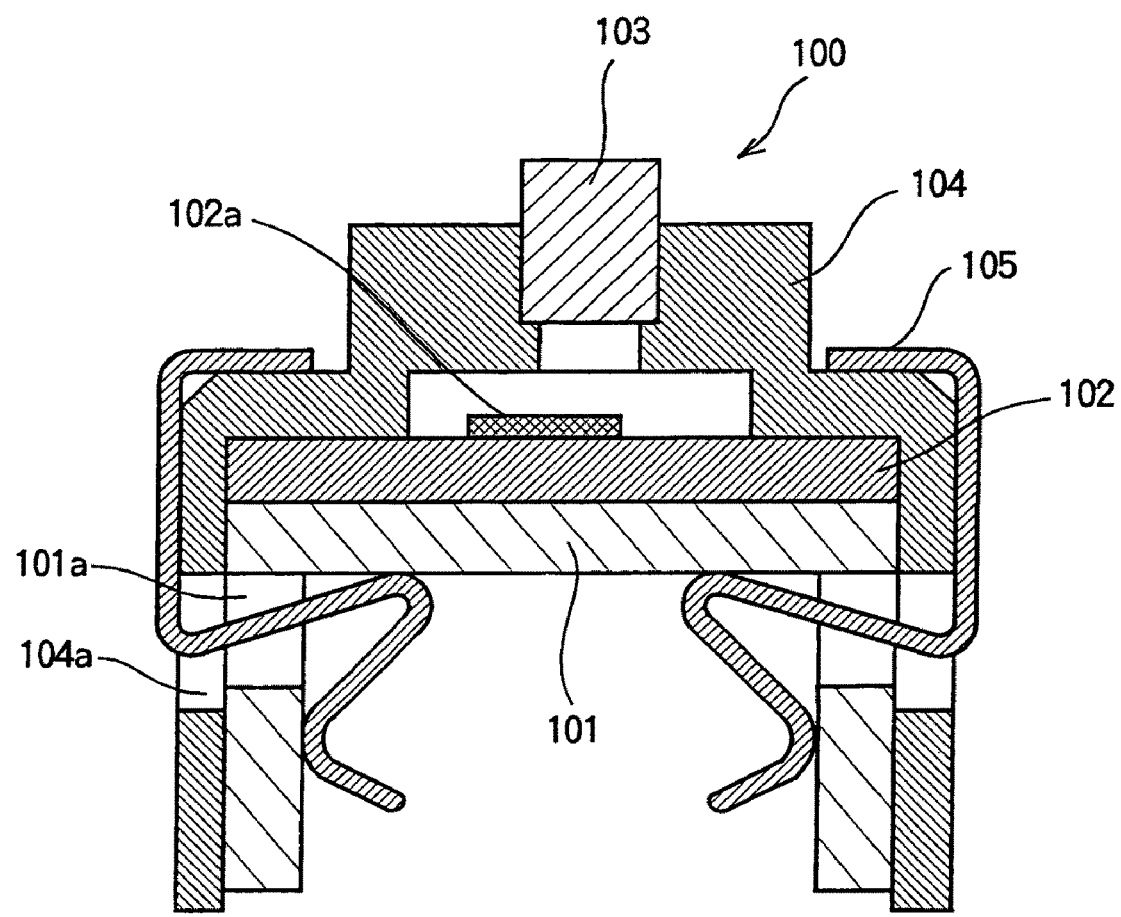
FIG. 11 is a cross-sectional view schematically showing the construction of an LED print head according to a third embodiment of the present invention.

FIG. 11 is a cross-sectional view schematically showing the construction of an LED print head according to a third embodiment of the present invention.

As shown in FIG. 11, an LED print head 100 of the third embodiment includes a base member 101, an LED unit 102 fixed to the base member 101, a rod lens array 103 containing an alignment of plural rod-shaped optical elements, a holder 104 which holds the rod lens array 103, and a clamp 105 which grips and fixes these components 101-104. In the figure, 101a and 104a are openings through which the clamp 105 penetrates. The LED unit 102 includes an LED array chip 102a. The LED array chip 102a includes one or more of the semiconductor devices of the first or second embodiment. Light generated by the LED array chip 102a passes through the rod lens array 103 and is emitted to the outside. The LED print head 100 is used as an exposure device for forming an electrostatic latent image in an electrophotographic printer or electrophotographic copier. The construction of the LED print head including the semiconductor device of the first or second embodiment is not limited to that shown in FIG. 11.

In the LED print head of the third embodiment, the LED unit 102 uses the semiconductor device of the first or second embodiment, so excellent light emission properties, device compactness and major material cost reductions can be achieved.

Fourth Embodiment

Figure 12:
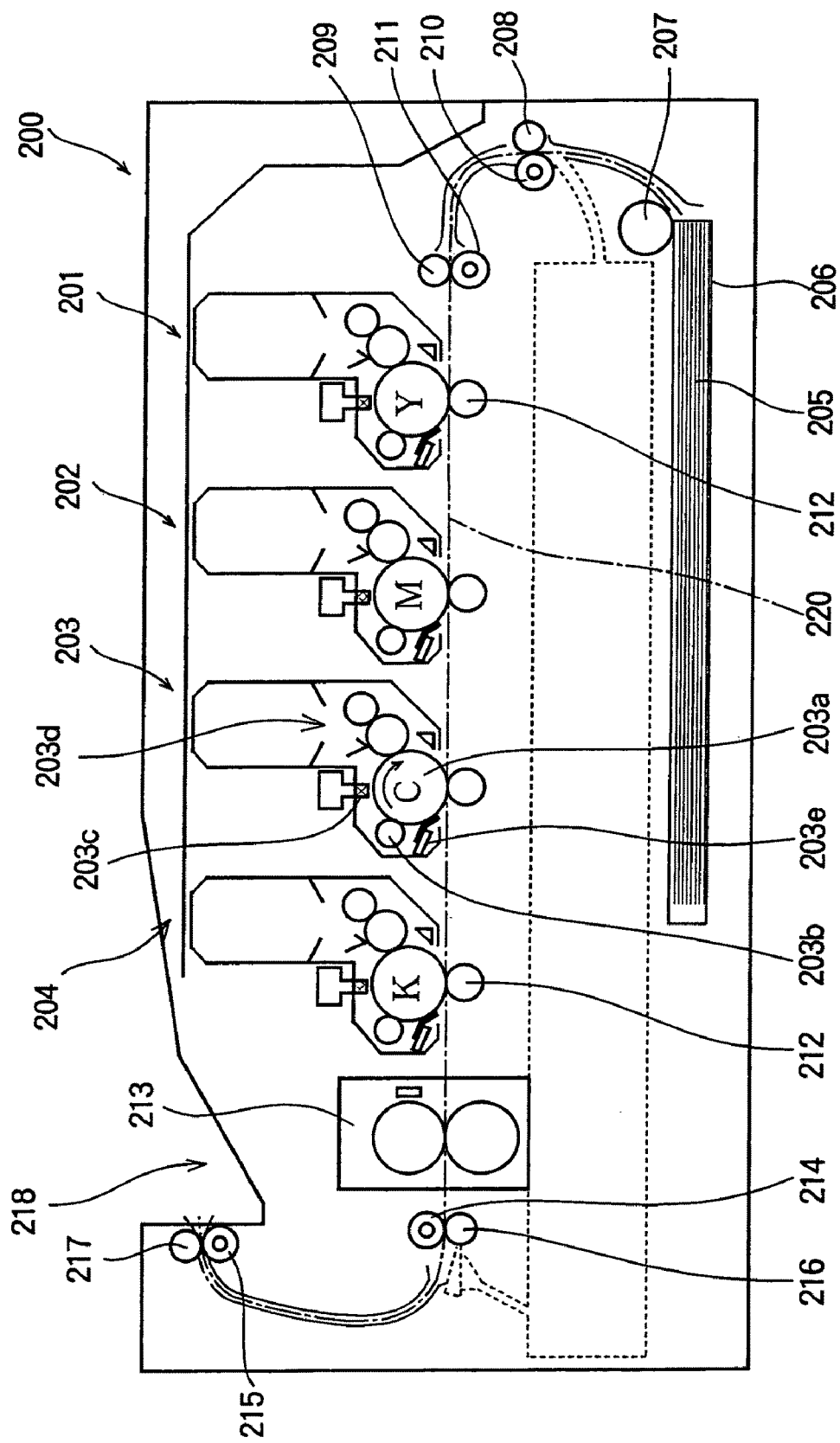
FIG. 12 is a cross-sectional view schematically showing the construction of an image-forming apparatus according to a fourth embodiment of the present invention.
Figure 13:
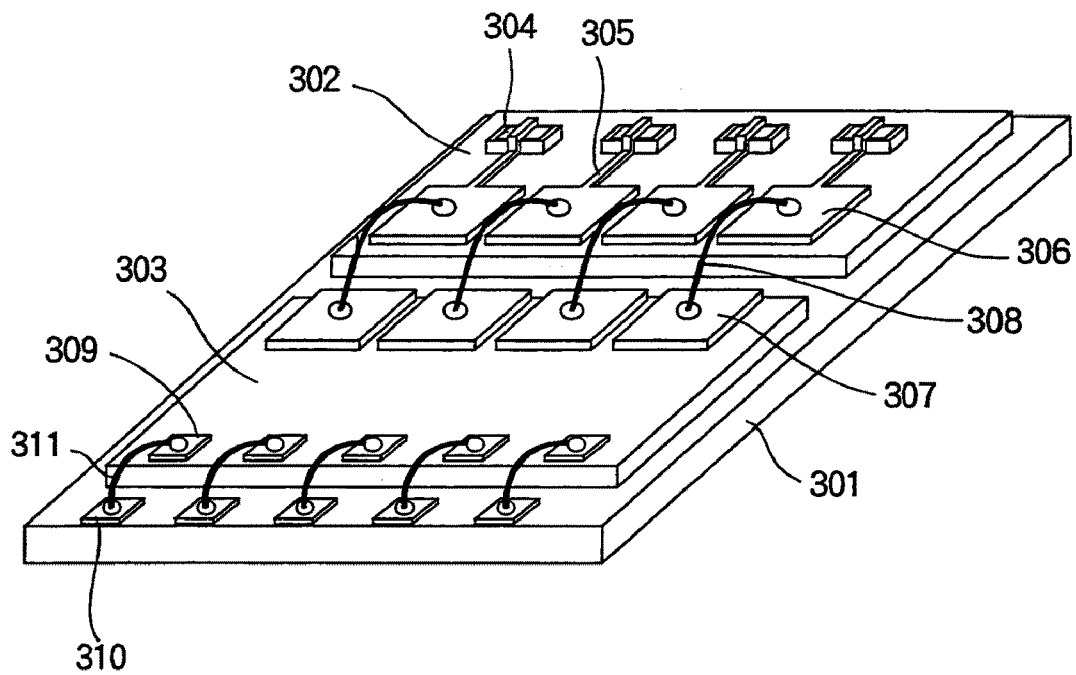
FIG. 13 is a perspective view schematically showing a conventional semiconductor device.
Figure 14:
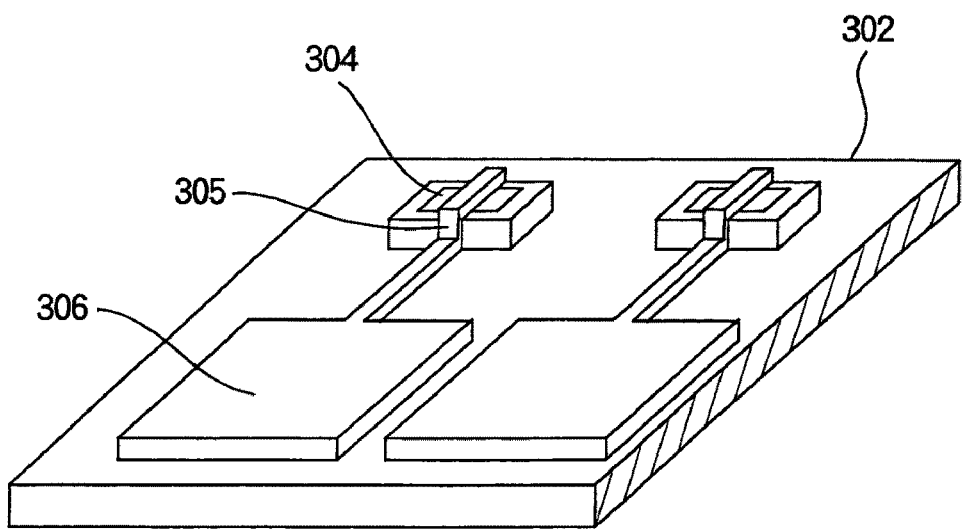
FIG. 14 is a perspective view showing an enlargement of part of an LED chip in the semiconductor device of FIG. 13.

FIG. 12 is a cross-sectional view schematically showing the construction of an image-forming apparatus according to a fourth embodiment of the present invention.

As shown in FIG. 12, an image-forming apparatus 200 of the fourth embodiment includes four process units 201-204 which form yellow (Y), magenta (M), cyan (C) and black (K) images by an electrophotographic technique. The process units 201-204 are tandemly arranged in the transport path of a recording medium 205. The process units 201-204 each include a photosensitive drum 203a which functions as an image carrier, a charging device 203b which is disposed near the photosensitive drum 203a and charges the surface of the photosensitive drum 203a, and an exposure device 203c which forms an electrostatic latent image by selectively irradiating the surface of the charged photosensitive drum 203a with light. The exposure device 203c is used for the LED print head 100 described in the third embodiment, and contains the semiconductor device described in the first or second embodiment.

The image-forming apparatus 200 also includes developing devices 203d which transport toner to the surface of the photosensitive drums 203 on which the electrostatic latent image is formed, and cleaning devices 203e which removes toner remaining on the surfaces of the photosensitive drums 203a. The photosensitive drums 203a each are rotated in the direction of the arrow by a drive mechanism including a power source, not shown, and gears. The image-forming apparatus 200 further includes a paper cassette 206 which houses the recording medium 205 such as paper or the like, and a hopping roller 207 which separates and transports the recording medium 205 one sheet at a time. Pinch rollers 208, 209, and resist rollers 210, 211 which correct the skew of the recording medium 205 together with the pinch rollers 208, 209 and transport it to the process units 201-204, are installed downstream of the hopping roller 207 in the transport direction of the recording medium 205. The hopping roller 207 and resist rollers 210, 211 rotate in synchronism with the power source, not shown.

The image-forming apparatus 200 further includes transfer rollers 212 disposed facing the photosensitive drums 203a. The transfer rollers 212 each are formed of semi-electrically conducting rubber or the like. The potentials of the photosensitive drum 203a and transfer roller 212 are set so that the toner image on the photosensitive drum 203a is transferred to the recording medium 205. Also, the image-forming apparatus is provided with a fixing device 213 which heats and pressurizes the toner image on the recording medium 205, and rollers 214, 216 and 215, 217 for ejecting the recording medium 205 which has passed through the fixing device 213.

The recording medium 205 stacked in the paper cassette 206 is separated and transported one sheet at a time by the hopping roller 207. The recording medium 205 passes through the resist rollers 210, 211 and pinch rollers 208, 209, and through the process units 201-204 in that order. In the process units 201-204, the recording medium 205 passes between the photosensitive drums 203a and the transfer rollers 212, whereupon color toner images are transferred in sequence, and heated/pressurized by the fixing device 213 so that the color toner images are fixed on the recording medium 205. Subsequently, the recording medium 205 is ejected to a stacker 218 by the ejecting rollers. The construction of the image-forming apparatus including the semiconductor device of the first or second embodiment or the LED print head of the third embodiment, is not limited to that shown in FIG. 12.

In the image-forming apparatus 200 of the fourth embodiment, the LED print head 100 of the third embodiment is used, so a high-quality image can be formed by the excellent light-emitting properties of the exposure device. Also, space is saved due to the compactness of the exposure device, and major material cost reductions can be achieved. The present invention may also be applied to a monochrome printer, but a particularly large advantage is obtained in the case of a full color printer having plural exposure units.

What is claimed is:

1. A semiconductor device comprising:
a substrate including a metal layer as an upper layer;
a semiconductor thin film having a first principal surface as a bonding area and a second principal surface which is an opposite surface of said first principal surface, said first principal surface of said semiconductor thin film being placed above and bonded to a top surface of said substrate having the metal layer, an area of said bonding area of said first principal surface of said semiconductor thin film being larger than an area of said second principal surface of said semiconductor thin film;
an interlayer insulating film disposed so as to cover said semiconductor thin film and said metal layer, said interlayer insulating film having an opening formed on a top contact area of said second principal surface; and
a discrete interconnection layer which extends from and on said top contact area, through said opening, through and on said interlayer insulating film, and to and on said substrate, so as to electrically couple said top contact area to said substrate.

2. The semiconductor device according to claim 1, wherein said semiconductor thin film includes a discrete operating region which has an operating layer, and a thinner region which is a thinned region of said semiconductor thin film, said thinned region forming a step of a reduced height on said substrate.

3. The semiconductor device according to claim 1, wherein said discrete interconnection layer is in direct contact with said top contact area, said interlayer insulating film, and said substrate, respectively.

4. The semiconductor device according to claim 1, wherein said substrate is a driving circuit substrate which includes an integrated circuit.

5. The semiconductor device according to claim 1, wherein said semiconductor thin film comprises a multilayer semiconductor epitaxial structure including, in order from a side of said substrate, a lower contact layer, a lower cladding layer, an activation layer as said operating layer, an upper cladding layer, and an upper contact layer,
wherein said thinner region is an element isolating region that includes said lower contact layer and part of said lower cladding layer.

6. The semiconductor device according to claim 1,
wherein said semiconductor thin film comprises a multilayer semiconductor epitaxial structure including, in order from a side of said substrate, a lower contact layer, a lower cladding layer, an activation layer as said operating layer, an upper cladding layer and an upper contact layer,
wherein said thinner region is an element isolating region that includes part of said lower contact layer.

7. The semiconductor device according to claim 6 further comprising:
a common interconnection layer extending from a top of said lower contact layer of said element isolating region to a top of said substrate.

8. The semiconductor device according to claim 1 further comprising:
a metal layer interposed between said substrate and said semiconductor thin film.

9. The semiconductor device according to claim 1, wherein said semiconductor thin film is bonded using an adhesive.

10. The semiconductor device according to claim 1,
wherein said discrete operating region comprises a light-emitting element.

11. The semiconductor device according to claim 1,
wherein said semiconductor thin film includes a plurality of discrete operating regions, and
said thinner region isolates said discrete operating regions mutually.

12. The semiconductor device according to claim 2,
wherein said discrete interconnection layer crosses edges of said discrete operating region and said thinner region.

13. An LED print head comprising:
said semiconductor device according to claim 1; and
a holder for holding said semiconductor device.

14. An image-forming apparatus comprising:
said LED print head according to claim 11; and
a photosensitive body installed facing said LED print head.

* * * * *